United States Patent
Cho et al.

(10) Patent No.: US 9,413,284 B2
(45) Date of Patent: Aug. 9, 2016

(54) VARIABLE DISPLAY DEVICE AND METHOD OF DRIVING THE SAME

(71) Applicant: LG Display Co., Ltd., Seoul (KR)

(72) Inventors: Seok-Hyo Cho, Goyang-si (KR); Hyun-Yong Uhm, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 171 days.

(21) Appl. No.: 14/139,034

(22) Filed: Dec. 23, 2013

(65) Prior Publication Data
US 2015/0092361 A1 Apr. 2, 2015

(30) Foreign Application Priority Data
Sep. 30, 2013 (KR) .................. 10-2013-0116807

(51) Int. Cl.
| | |
|---|---|
| *G06F 1/16* | (2006.01) |
| *H02P 29/00* | (2016.01) |
| *H02K 7/00* | (2006.01) |
| *H02K 7/075* | (2006.01) |
| *H05K 5/02* | (2006.01) |
| *F16M 11/04* | (2006.01) |
| *G09F 9/30* | (2006.01) |

(52) U.S. Cl.
CPC ........... *H02P 29/0011* (2013.01); *F16M 11/04* (2013.01); *G09F 9/301* (2013.01); *H02K 7/00* (2013.01); *H02K 7/075* (2013.01); *H05K 5/02* (2013.01)

(58) Field of Classification Search
CPC .......... H05K 1/02; H05K 1/028; H05K 5/00; H05K 5/0017
USPC .................. 361/749; 310/80; 318/14
See application file for complete search history.

(56) References Cited

U.S. PATENT DOCUMENTS

| | | | |
|---|---|---|---|
| 8,804,324 B2 * | 8/2014 | Bohn | G06F 1/1616 345/1.1 |
| 8,971,031 B2 * | 3/2015 | Mok | G06F 1/1652 349/58 |
| 2013/0010405 A1 * | 1/2013 | Rothkopf | H04M 1/0216 361/679.01 |

FOREIGN PATENT DOCUMENTS

WO   WO 2014157768 A1 * 10/2014   ............... G09F 9/30

* cited by examiner

*Primary Examiner* — Hoa C Nguyen
*Assistant Examiner* — Roseline Alicea Rivera
(74) *Attorney, Agent, or Firm* — Dentons US LLP

(57) ABSTRACT

A variable display device includes a display panel; a joint plate installed at a rear surface of the display panel and including a plurality of plates each configured to be rotated by a hinge; and a driving system installed at a rear surface of the joint plate and rotating the plurality of plates with respect to a normal direction to the joint plate, wherein the display panel is variably driven in a flat mode having a flat surface or a curved mode having a curved surface by the joint plate and the driving system.

17 Claims, 6 Drawing Sheets

VARIABLE DISPLAY DEVICE AND METHOD OF DRIVING THE SAME

The application claims the benefit of priority to Korean Patent Application No. 10-2013-0116807 filed in Korea on Sep. 30, 2013, which is hereby incorporated by reference for all purposes as if fully set forth herein.

BACKGROUND OF THE INVENTION

1. Field of the Invention

The present invention relates to a variable display device, and more particularly, to a variable display device and method of driving the same in a flat mode and a curved mode.

2. Discussion of the Related Art

With rapid development of information technologies, display devices for displaying a large amount of information have been promptly developed. More particularly, various flat panel display (FPD) devices have been introduced and spotlighted.

The flat panel display devices include, for example, liquid crystal display (LCD) devices, plasma display panel (PDP) devices, field emission display (FED) devices, electroluminescence display (ELD) devices, and organic electroluminescent display (OLED) devices. The flat panel display devices generally have a thin profile, light weight and low power consumption and have been rapidly replacing cathode ray tubes (CRT).

Recently, curved display devices have emerged as the next generation display device because the curved display devices enable a user to be further immersed in watching, to watch realistic images and to feel comfortable.

In curved display devices, since a distance from the eyes of the user to a center of the screen is equal to a distance from the eyes of the user to sides of the screen, distortion of an image and a decrease in awareness at the sides that the image is blurred at an end viewing angle are minimized. The curved display devices may have advantages such as better use of space, the interior and the design and may be used for various applications.

Meanwhile, variable display devices having the advantages of the flat panel display devices with wide viewing angles and the curved display devices with increased immersion and comfortableness have been pursued and researched.

SUMMARY OF THE INVENTION

Accordingly, the present invention is directed to a variable display device and method of driving the same that substantially obviates one or more of the problems due to limitations and disadvantages of the related art.

An advantage of the present invention is to provide a variable display device that is driven in a flat mode and in a curved mode, and a method of driving the same.

To achieve these and other advantages and in accordance with the purpose of embodiments of the invention, as embodied and broadly described, a variable display device may include a display panel; a joint plate installed at a rear surface of the display panel and including a plurality of plates each configured to be rotated by a hinge; and a driving system installed at a rear surface of the joint plate and rotating the plurality of plates with respect to a normal direction to the joint plate, wherein the display panel is variably driven in a flat mode having a flat surface or a curved mode having a curved surface by the joint plate and the driving system.

In another aspect, a method of driving a variable display device, which includes a display panel; a joint plate installed at a rear surface of the display panel; and including a plurality of plates each configured to be rotated by a hinge; and a driving system installed at a rear surface of the joint plate and rotating the plurality of plates with respect to a normal direction to the joint plate, wherein the display panel is variably driven in a flat mode having a flat surface or a curved mode having a curved surface by the joint plate and the driving system, includes first rotating the plurality of plates by the driving system with increasing rotational angles as approaching both edge portions of the joint plate from a center portion of the joint plate; driving the variable display device in a curved mode such that the display panel has a curved surface according to the first rotating the plurality of plates; second rotating the plurality of plates by the driving system such that the plurality of plates are disposed on a line; and driving the variable display device in a flat mode such that the display panel has a flat surface according to the second rotating the plurality of plates.

In another aspect, a method of driving a variable display device, which includes a display panel; a joint plate installed at a rear surface of the display panel; and a driving system installed at a rear surface of the joint plate, wherein the driving system includes a motor, an eccentric cam being eccentric with respect to a rotation axis of the motor, a shaft connected to the eccentric cam through a ball bearing, a couple of first levers having first ends fixed to a central area of the joint plate and second ends, a couple of second levers having third ends connected to the second ends through a shaft bearing and fourth ends fixed to an edge portion of the joint plate, an angle bearing installed to the shaft, a couple of bearing stoppers disposed at both sides of the angle bearing and fixed to the joint plate, and a shaft fixing block supporting an end of the shaft, and wherein a spring is wound around the shaft between the angle bearing and the shaft fixing block, includes rotating the eccentric cam at each of both edge portions of the joint plate by driving the motor; elastically compressing the spring by moving the shaft and the angle bearing toward a first direction by rotation of the eccentric cam; pushing and raising the shaft bearing; raising connecting portions of the first and second levers by the shaft bearing; rotating first, second, third, fourth and fifth plates of the joint plate connected to the first and second levers such that the first, second, third, fourth and fifth plates are rotated toward an opposite direction to the rear surface of the joint plate with increasing rotational angles as approaching edge portions of the joint plate from a center of the joint plate; driving the variable display device in a curved mode such that the display panel has a curved surface according to the joint plate; expanding and restoring the spring by rotating the eccentric cam by the motor, thereby moving the shaft toward a second direction opposite to the first direction; lowering the shaft bearing; lowering the connecting portions of the first and second levers by the shaft bearing; rotating the first, second, third, fourth and fifth plates of the joint plate connected to the first and second levers such that the first, second, third, fourth and fifth plates are disposed on a line; and driving the variable display device in a flat mode such that the display panel has a flat surface according to the joint plate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1A:
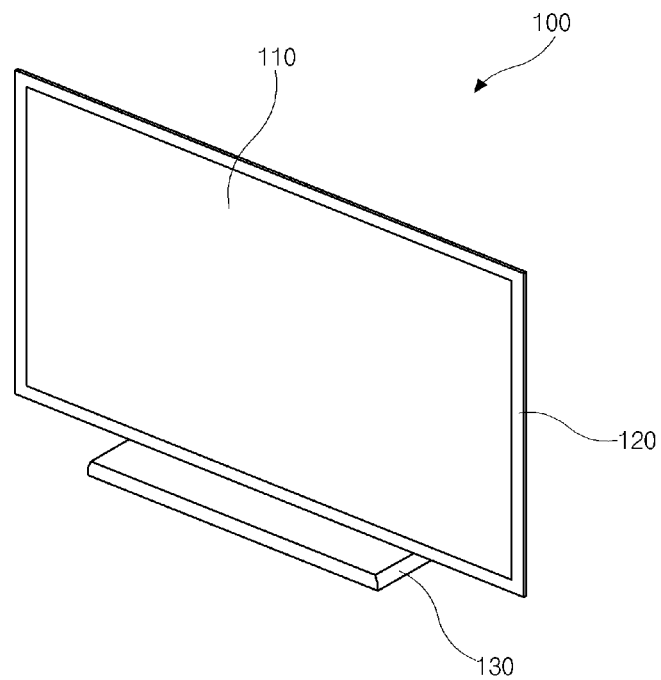
FIG. 1A and FIG. 1B are perspective views schematically illustrating a variable display device according to an exemplary embodiment of the present invention.
Figure 1B:
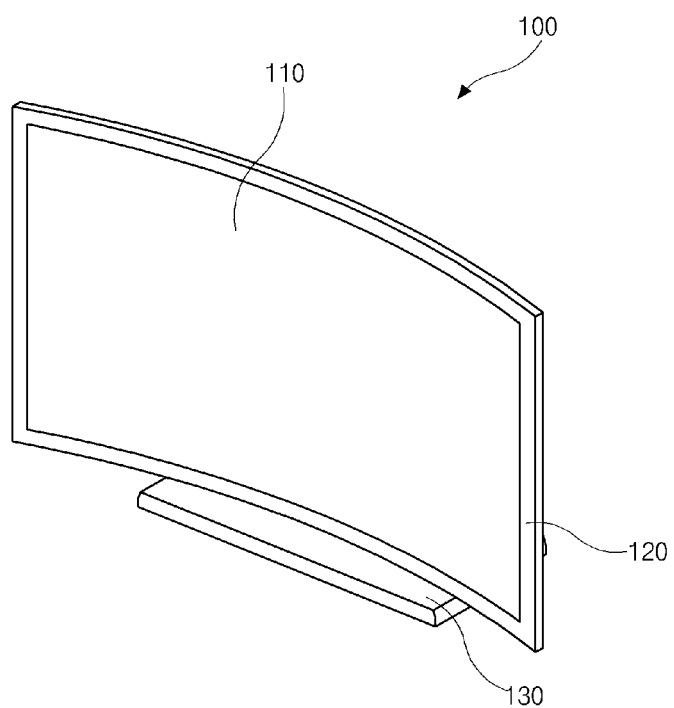
Figure 2:
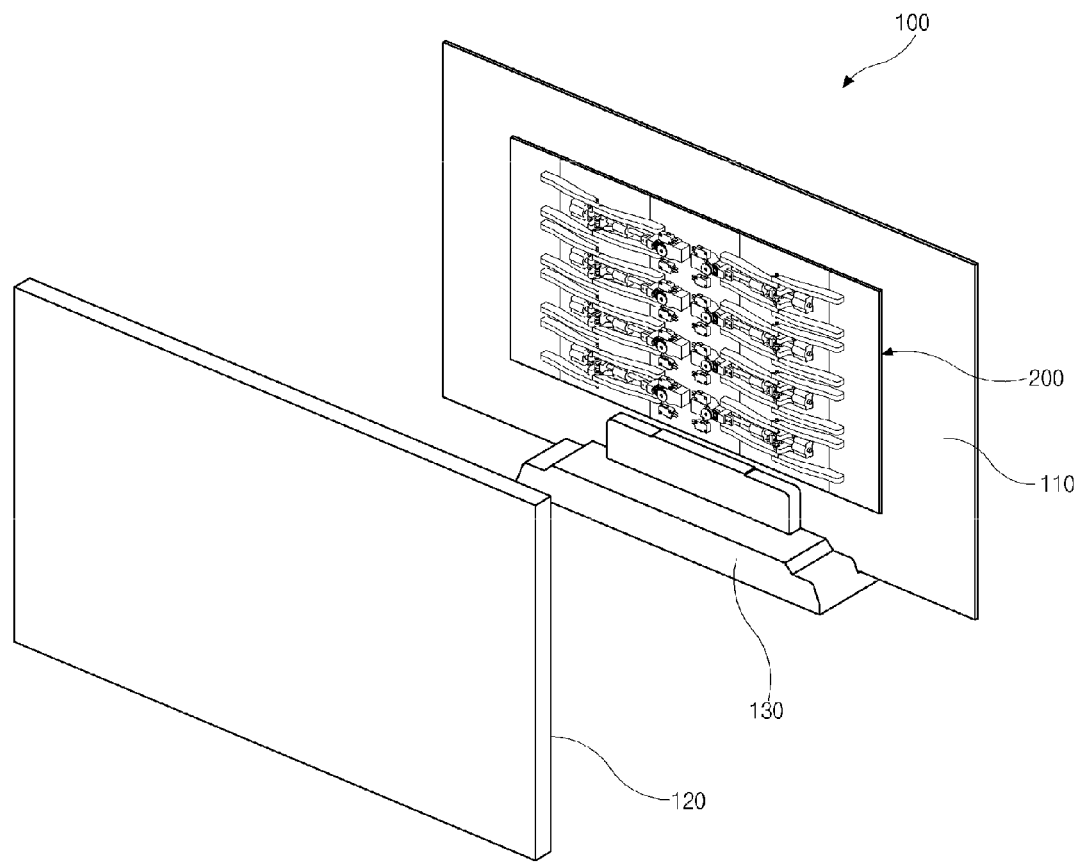
FIG. 2 is a perspective view schematically illustrating a rear side of a variable display device according to an exemplary embodiment of the present invention.

FIG. 1A and FIG. 1B are perspective views schematically illustrating a variable display device according to an exemplary embodiment of the present invention, and FIG. 2 is a perspective view schematically illustrating a rear side of a variable display device according to an exemplary embodiment of the present invention.

In FIGS. 1A and 1B and FIG. 2, the variable display device 100 according to the exemplary embodiment of the present invention includes a display panel 110, an external case 120 and a support 130. The display panel 110 displays images, and the external case 120 accommodates the display panel 110. The support 130 is connected to a lower part or a rear part of the external case 120 and is fixed to a desk or a surface of a wall.

At this time, a cover glass (not shown) may be disposed at a front side of the display device 110 to protect the display panel 110.

Here, the display panel 110 may be one of a liquid crystal display (LCD) device, a plasma display panel (PDP) device, a field emission display (FED) device, an electroluminescence display (ELD) device, and an organic light emitting diode (OLED) device. Beneficially, the display panel 110 may be an OLED device, which displays images even when it is bent like a paper.

Since OLED devices are self-luminescent, the OLED devices do not require a backlight unit and have a thin profile and light weight as compared with LCD devices, which are non self-luminescent.

In addition, the OLED devices have better viewing angles and contrast ratio than the LCD devices and have merits in power consumption. The OLED devices are driven by low voltage of direct current (DC), and have relatively fast response time. Since the OLED devices include solid components, the OLED devices are resistant to outer impacts and are stable under temperatures within a wide range.

Particularly, since a manufacturing process of the OLED devices is very simple, manufacturing costs of the OLED device are further reduced as compared with an LCD device.

The display panel 110, which is an OLED device, includes a first substrate and a second substrate facing each other. The first and second substrates are spaced apart from and attached to each other by a protection layer having an adhesive property.

More particularly, although not shown in the figures, a driving thin film transistor is formed in each pixel region on the first substrate, and a first electrode, an organic light-emitting layer and a second electrode are sequentially formed on the first substrate. The first electrode is formed in each pixel region and connected to the driving thin film transistor. The organic light-emitting layer emits light. The organic light-emitting layer may be formed in each pixel region. The second electrode is formed all over the first substrate and covers the organic light-emitting layer.

The organic light-emitting layer may emit red, green or blue light and may be formed by patterning an organic material emitting red, green or blue light in each pixel region. Thus, red, green and blue pixel regions are sequentially arranged.

The first and second electrodes and the organic light-emitting layer constitute a light-emitting diode. At this time, the display panel 110 may include the first electrode as an anode and the second electrode as a cathode.

The display panel 110 may further include a polarizing unit for preventing external light from being reflected.

As illustrated in FIG. 1A, when the display panel 110 is driven in a flat mode, the variable display device 100 has relatively wide viewing angles and provides many viewers with news or advertisements from images displayed by the display panel 110.

Alternatively, as illustrated in FIG. 1B, when the display panel 110 is driven in a curved mode, the variable display device 100 enables a viewer to be further immersed in watching, to watch realistic images and to feel comfortable.

Namely, since the variable display device 100 is variably driven in the flat mode and in the curved mode, a user can selectively use the variable display device 100 of the flat mode or curved mode as occasion demands.

The variable display device 100 is variably driven in the flat mode and in the curved mode by a backcover system 200, which is installed at a rear surface of the display panel 110, as illustrated in FIG. 2. This will be described in more detail with reference to accompanying drawings.

Figure 3:
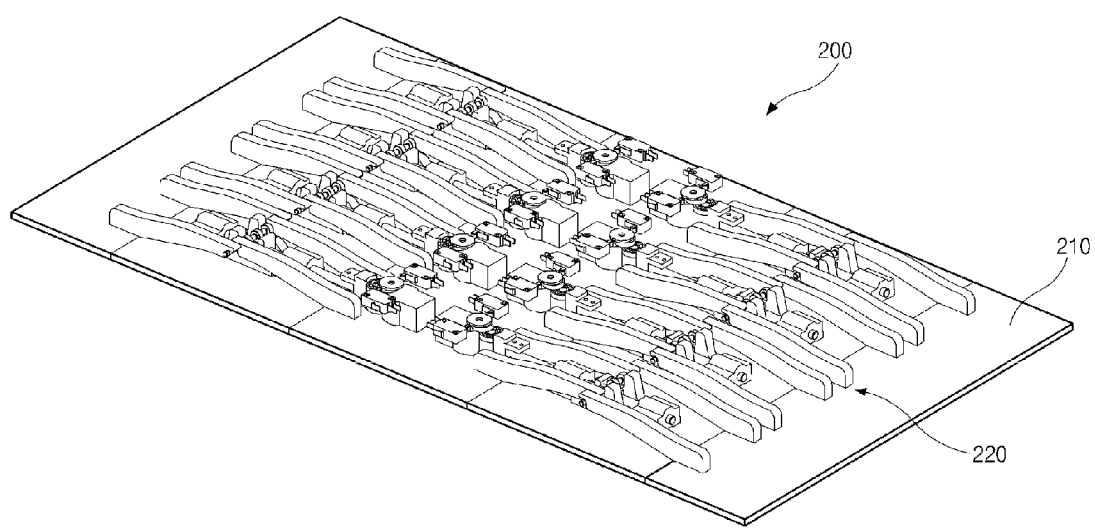
FIG. 3 is a perspective view schematically illustrating a backcover system according to an exemplary embodiment of the present invention.
Figure 4A:
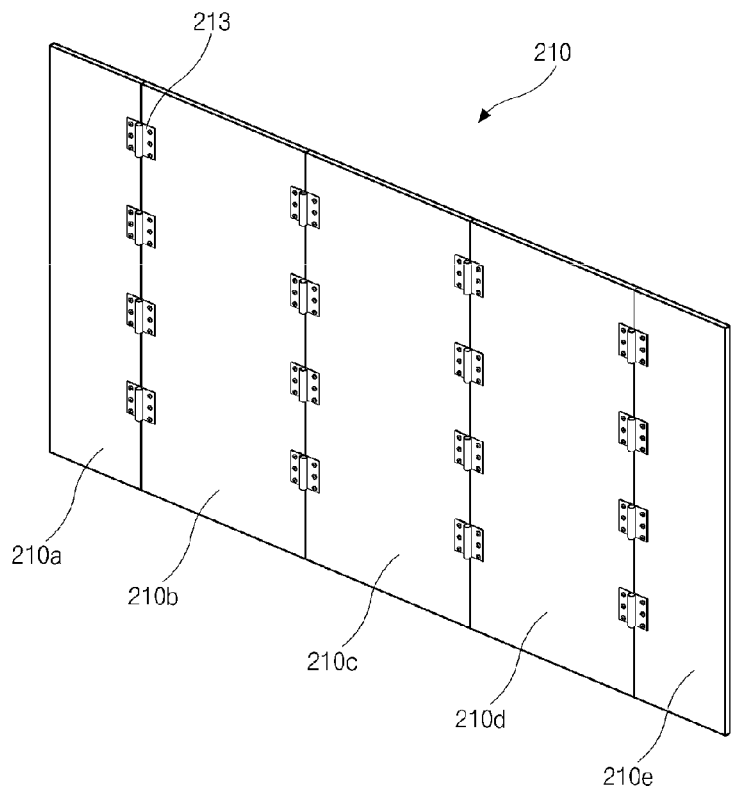
FIG. 4A is a perspective view schematically illustrating a joint plate according to an exemplary embodiment of the present invention.

FIG. 3 is a perspective view schematically illustrating a backcover system according to an exemplary embodiment of the present invention. FIG. 4A is a perspective view schematically illustrating a joint plate according to an exemplary embodiment of the present invention, and FIG. 4B is a perspective view schematically illustrating a driving system according to an exemplary embodiment of the present invention.

Figure 4B:
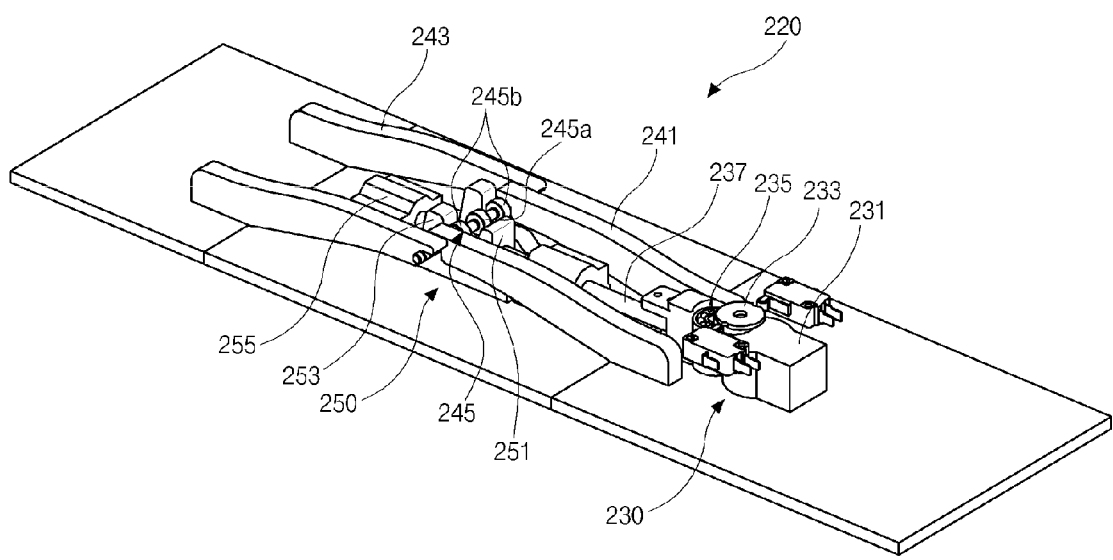
FIG. 4B is a perspective view schematically illustrating a driving system according to an exemplary embodiment of the present invention.

In FIG. 3 and FIGS. 4A and 4B, the backcover system 200 includes the joint plate 210 and the driving system 220. The joint plate 210 contacts the rear surface of the display panel 110 of FIG. 2 and applies pressure to the display panel 110 such that the display panel 110 switches between the flat mode and the curved mode. The driving system 220 is installed to the joint plate 210 and tilts the joint plate 210 at a predetermined angle.

Referring to FIG. 4A, the joint plate 210 has a shape and a size corresponding to the display panel 110 of FIG. 2 and includes first, second, third, fourth and fifth plates 210a, 210b, 210c, 210d and 210e by dividing both edge portions and a central portion and dividing the central portion into at least three equal parts. The second, third and fourth plates 210b, 210c and 210d have the same size, which is larger than that of the first and fifth plates 210a and 210e.

Each of the first, second, third, fourth and fifth plates 210a, 210b, 210c, 210d and 210e is connected to adjacent plate or plates by hinge brackets 213. The hinge brackets 213 each include pins and springs inside and are combined with the plates 210a, 210b, 210c, 210d and 210e to be rotated as a hinge.

Therefore, the first, second, third, fourth and fifth plates 210a, 210b, 210c, 210d and 210e are rotated toward the display panel 110 of FIG. 2 with respect to a normal direction to the third plate 210c on the center. At this time, the first, second, third, fourth and fifth plates 210a, 210b, 210c, 210d and 210e are rotated with increasing rotational angles as approaching the first and fifth plates 210a and 210e at both edge portions from the third plate 210c at the central portion.

That is, the joint plate 210 has a shape such that the both edge portions are curved with respect to the normal direction. At this time, since the joint plate 210 includes first, second, third, fourth and fifth plates 210a, 210b, 210c, 210d and 210e, a precise curvature can be substantially formed.

As illustrated in FIG. 4B, the driving system 220, which is installed to a rear surface of the joint plate 210, includes a motor unit 230, a couple of first levers 241, a couple of second levers 243, and a driving unit 250. The couple of second levers 243 are connected to the couple of first levers 241 by a shaft bearing 245, and the driving unit 250 moves connecting portions of the first and second levers 241 and 243 through the shaft bearing 245.

The driving system 220 is installed at each of both sides of the center of the joint plate 210, that is, the third plate 210c. Beneficially, more than one driving system 210 may be installed at each side of the third plate 210c.

Here, the motor unit 230 includes a motor 231, an eccentric cam 233 and a shaft 237. The motor 231 generates rotatory power, and the eccentric cam 233 eccentrically rotates. The shaft 237 is connected to the eccentric cam 233 through a ball bearing 235 and is disposed movably forward and backward by rolling motion of the eccentric cam 233.

The motor unit 230 is beneficially disposed at a central area of the joint plate 210.

First ends of the couple of first levers 241 are fixed to the central area of the joint plate 210 in which the motor unit 230 is disposed, and second ends of the couple of first levers 241 are connected to third ends of the couple of second levers 243 through the shaft bearing 245.

Fourth ends of the couple of second levers 243 are connected to the edge portion of the joint plate 210.

The shaft bearing 245 includes a first roller 245a and a couple of second rollers 245b at both sides of the first roller 245a. The driving unit 250 is disposed in the connecting portions of the first and second levers 241 and 243 where the shaft bearing 245 is located.

Figure 5A:
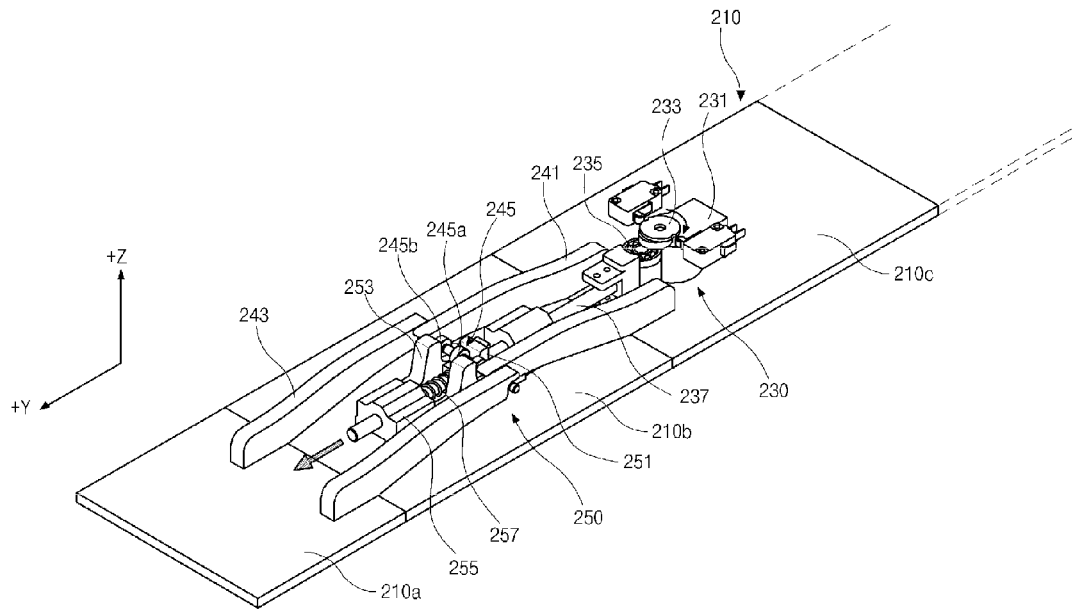
FIGS. 5A and 5B are perspective views schematically illustrating a driving system installed at a side of a backcover system according to an exemplary embodiment of the present invention.

The driving unit 250 includes an angle bearing 251 installed to the shaft 237 of the motor unit 230, a couple of bearing stoppers 253 disposed at both sides of the angle bearing 251 and fixed to the joint plate 210, and a shaft fixing block 255 supporting an end of the shaft 237. A spring 257 of FIG. 5A is wound around the shaft 237 between the angle bearing 251 and the shaft fixing block 255.

The angle bearing 251 gives pressure to and vertically pushes up the first roller 245a of the shaft bearing 245. The angle bearing 251 has an inclined surface, which contacts the first roller 245a and has a slope in a forwarding direction of the shaft 237 with respect to the joint plate 210.

The couple of bearing stoppers 253 are disposed to correspond to the couple of second rollers 245b. The couple of bearing stoppers 253 give pressure to and vertically push up the couple of second rollers 245b.

At this time, the couple of bearing stoppers 253 have curved surfaces, which face the inclined surface of the angle bearing 251, and the second rollers 245b roll and vertically rise along the curved surfaces of the bearing stoppers 253.

As mentioned above, the variable display device 100 of FIG. 2 of the present invention is selectively, variably used as the flat mode and the curved mode by the backcover system 200 installed to the rear surface of the display panel 110 of FIG. 2.

Here, a variable process of the variable display device 100 of FIG. 2 from the flat mode to the curved mode by the backcover system 200 will be described in more detail.

FIGS. 5A to 5D are views schematically illustrating a variable display device according to an exemplary embodiment of the present invention when it is varied from a flat mode to a curved mode. For convenience of explanation, the driving system will be described in detail.

Figure 5B:
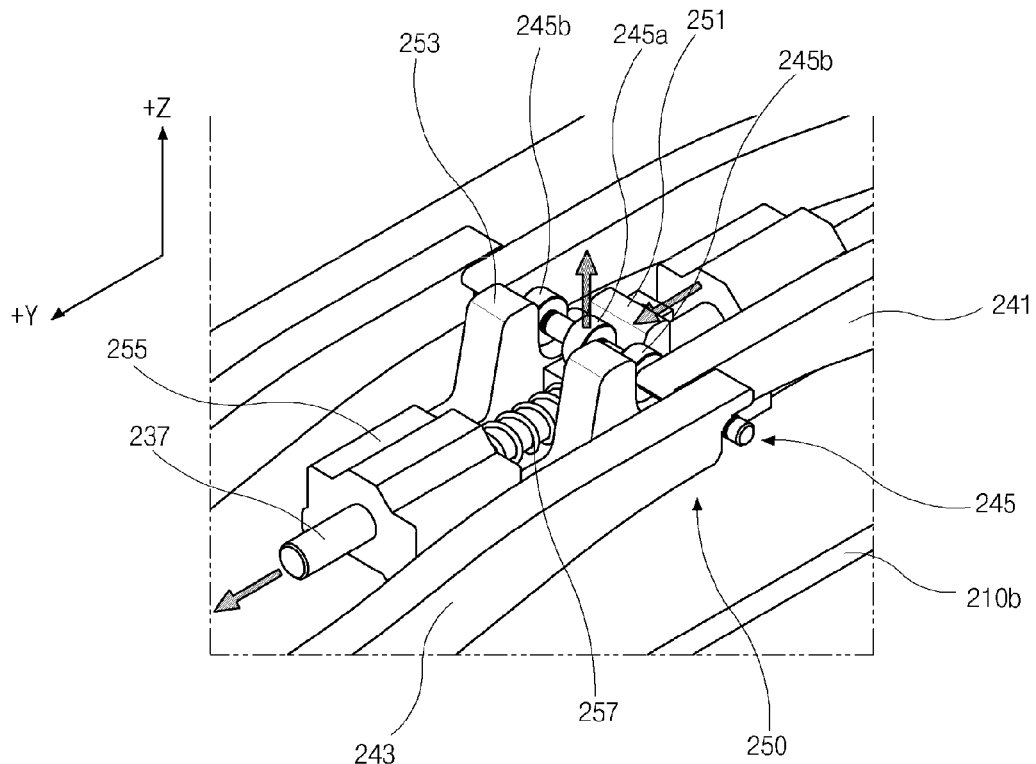
Figure 5C:
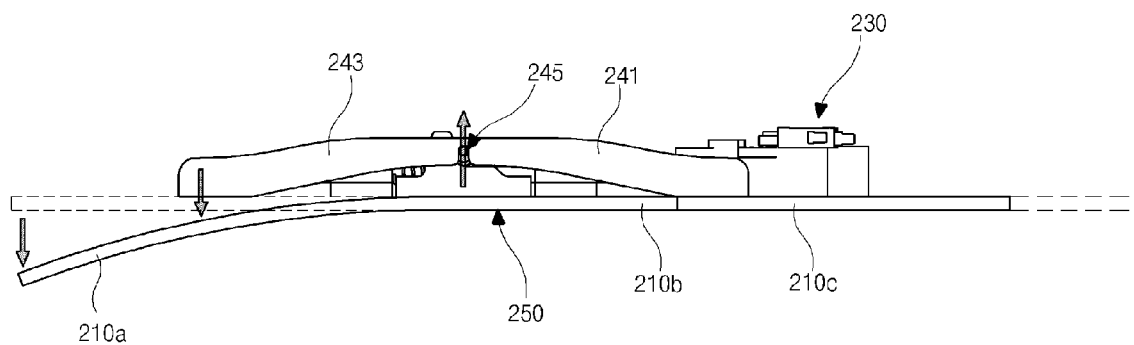
FIG. 5C is a cross-sectional view of FIG. 5B.
Figure 5D:
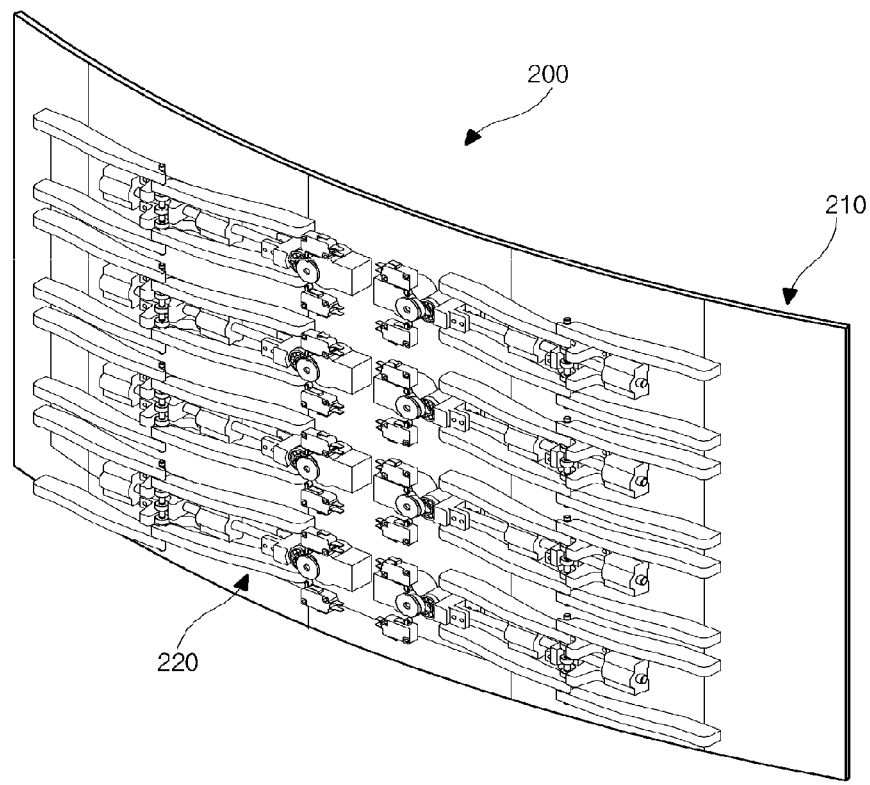
FIG. 5D is a perspective view schematically illustrating a backcover system in a curved mode according to an exemplary embodiment of the present invention.

FIGS. 5A and 5B are perspective views schematically illustrating a driving system installed at a side of a backcover system according to an exemplary embodiment of the present invention, FIG. 5C is a cross-sectional view of FIG. 5B, and FIG. 5D is a perspective view schematically illustrating a backcover system in a curved mode according to an exemplary embodiment of the present invention.

In FIG. 5A, the motor unit 230 is fixed to the third plate 210c of the joint plate 210. The first ends of the couple of first levers 241 are fixed to the third plate 210c in which the motor unit 230 is disposed, and the second ends of the couple of first levers 241 are connected to the third ends of the couple of second levers 243 through the shaft bearing 245. The fourth ends of the couple of second levers 243 are fixed to the first plate 210a.

At this time, the connecting portions of the first and second levers 241 and 243 are disposed at a central area of the second plate 210b, and the driving unit 250 is disposed at the central area of the second plate 210b.

Here, when the motor 231 of the motor unit 230 is driven, the eccentric cam 233 rotates halfway in one direction, and the shaft 237 moves toward a direction opposite the motor 231, that is, the +Y axis defined in the figures, by rolling contact of the ball bearing 235 due to the rotation of the eccentric cam 233.

The spring 257 wound around the shaft 237 between the angle bearing 251 and the shaft fixing block 255 is elastically compressed by movement of the shaft 237 to the +Y axis.

Then, in FIG. 5B, the first roller 245a of the shaft bearing 245 is pressed by the inclined surface of the angle bearing 251 and pushed and raised toward a vertical direction, that is, the +Z axis defined in the figures, and at the same time, the second rollers 245b of the shaft bearing 245 are pushed and raised toward the +Z axis along the curved surfaces of the couple of bearing stoppers 253.

Accordingly, the whole shaft bearing 245 is pushed and raised toward the +Z axis, and the first and third ends of the first and second levers 241 and 243, which are connected to each other through the shaft bearing 245, are also lifted toward the +Z axis.

Since the first and third ends of the first and second levers 241 and 243 are lifted, the first plate 210 to which the fourth ends of the second levers 243 are fixed is raised together, and as illustrated in FIG. 5C, the first plate 210a is bent toward the −Z axis and is rotated with a predetermined angle by the hinge brackets 213 of FIG. 4A between the first plate 210a and the second plate 210b.

At this time, the first plate 210a is more pressured by the second levers 243 and is rotated more than the second plate 210b. The first, second and third plates 210a, 210b and 210c have a curved shape.

A driving system installed to the other side of the backcover system 200 is driven by the same way as described above, and as illustrated in FIG. 5D, the backcover system 200 is curved as a whole with respect to the normal direction.

In the present invention, the backcover system 200 installed to the rear surface of the display panel 110 of FIG. 2 is rotated as a whole with respect to the normal direction such that rotating angles increase as approaching from the central portion to the both edge portions. Thus, the display panel 110 of FIG. 2 is driven in the curved mode where the display panel 110 of FIG. 2 has a curved surface with respect to the normal direction by the backcover system 200.

On the other hand, when the variable display device 100 of FIG. 2 is varied from the curved mode to the flat mode, the motor 231 of the motor unit 230 is driven, and the eccentric cam 233 rotates halfway in the one direction. Then, the spring 257 elastically compressed between the angle bearing 251 and the shaft fixing block 255 is expanded and restored, and the shaft 237 moves toward a direction facing the motor 231, that is, the −Y axis defined in the figures.

With the movement of the shaft 237 toward the −Y axis, the angle bearing 251 also moves toward the −Y axis. The shaft bearing 245, which was pressed by the inclined surface of the angle bearing 251 and the curved surfaces of the bearing stoppers 253 and pushed and raised toward the +Z axis, is lowered.

Accordingly, the first and second levers 241 and 243 are lowered, and the first plate 210a, which was bent toward the −Z axis and rotated to form the curved surface, return to its original position. The first, second and third plates 210a, 210b and 210c are disposed parallel in a line, and the variable display device 100 of FIG. 2 is driven in the flat mode.

As disclosed above, the variable display device 100 of FIG. 2 is selectively, variably driven in the flat mode or in the curved mode by the backcover system 200, which is installed at the rear surface of the display panel 110 of FIG. 2.

Namely, in an open space such as an outdoor or indoor square such as airports or terminals, the variable display device of the present invention is driven in the flat mode such that the variable display device has wide viewing angles and news or advertisements from images displayed by the display panel are provided to many viewers. Alternatively, the variable display device of the present invention is driven in the curved mode such that the viewer is further immersed in watching, watches more realistic images and feels comfortable.

Accordingly, the user can selectively use the variable display device 100 of FIG. 2 as the flat mode or the curved mode as occasion demands.

In the meantime, the motor 231 of the motor unit 230 may include an AC motor, and the motor 231 may be installed such that the eccentric cam 233 is eccentric with respect to its rotation axis.

Therefore, the variable display device 100 of FIG. 2 is variable between the flat mode and the curved mode due to the halfway rotation of the motor 231.

At this time, when the variable display device 100 of FIG. 2 is variable between the flat mode and the curved mode, vibrations or noises may hardly occur.

Figure 6:
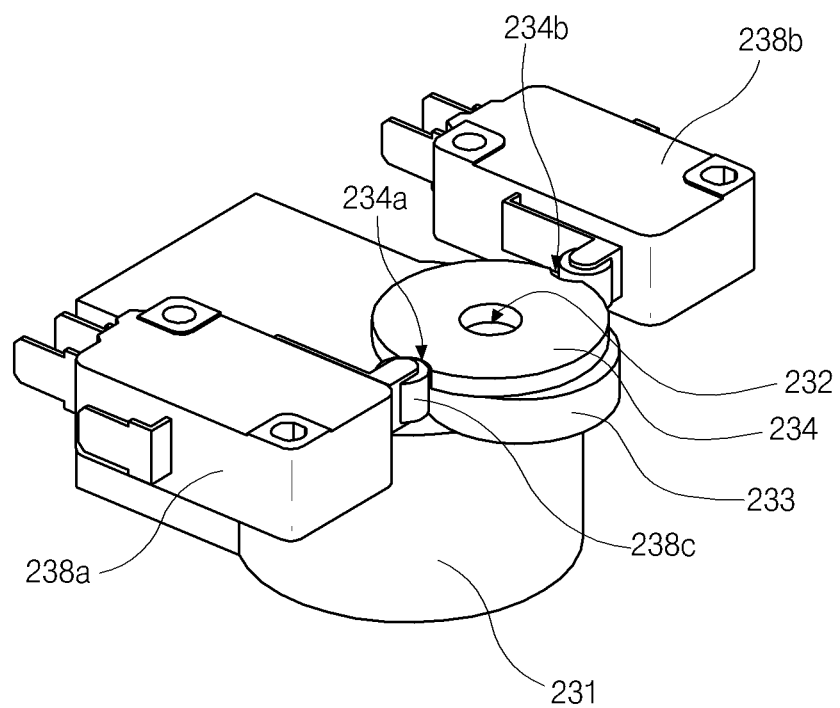
FIG. 6 is a perspective view schematically illustrating a motor unit.

That is, as illustrated in FIG. 6, the eccentric cam 233 is installed eccentrically to the rotation axis 232 of the motor 231, and a switch cam 234 is installed onto the eccentric cam 233. The switch cam 234 includes first and second switch grooves 234a and 234b to control off of the motor 231.

In addition, first and second motor switches 238a and 238b are installed at both sides of the switch cam 234. The first and second motor switches 238a and 238b have switches 238c corresponding to the first and second switch grooves 234a and 234b.

The first and second switch grooves 234a and 234b face each other, and the switch cam 234 rotates with the eccentric cam 233 by the rotation of the motor 231. When the eccentric cam 233 and the switch cam 234 rotate halfway, the first switch groove 234b of the switch cam 234, which contacted the switch 238c of the first motor switch 238a, contacts the switch 238c of the second motor switch 238b.

At this time, off signals from the motor switches 238a and 238b are provided to the motor 231, and the motor 231 stops rotating.

In the variable display device 100 of FIG. 2 of the present invention, since the motor 231 and the eccentric cam 233 rotate halfway, the vibrations and noises due to the rotation of the motor 231 and the eccentric cam 233 hardly occur.

As mentioned above, the variable display device 100 of FIG. 2 is selectively, variably driven in the flat mode or in the curved mode by the backcover system 200, which is installed at the rear surface of the display panel 110 of FIG. 2.

Accordingly, in an open space such as an outdoor or indoor square such as airports or terminals, the variable display device of the present invention is driven in the flat mode such that the variable display device has wide viewing angles and news or advertisements from images displayed by the display panel are provided to many viewers. Alternatively, the variable display device of the present invention is driven in the curved mode such that the viewer is further immersed in watching, watches more realistic images and feels comfortable. The variable display device of the present invention can be selectively used for the convenience of the user.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A variable display device, comprising:
   a display panel;
   a joint plate installed at a rear surface of the display panel and including a third plate that is a center plate between a plurality of plates including first, second, fourth and fifth plates each configured to be rotated by a hinge; and
   a pair of driving systems installed at a rear surface of the joint plate, facing against each other and rotating the plurality of plates with respect to a normal direction to the joint plate, each driving system including a motor unit on the center plate and a driving unit on an immediately adjacent plate,
   wherein the motor unit includes a motor, an eccentric cam being eccentric with respect to a rotation axis of the motor, and a shaft connected to the eccentric cam, and wherein the motor eccentrically rotates the eccentric cam in less than a full revolution, which moves the shaft in a linear direction substantially parallel with the rotation axis of the motor, depending on a rotational direction of the eccentric cam, and wherein the display panel is variably driven in a flat mode having a flat surface or a curved mode having a curved surface by the joint plate and the driving system, wherein each driving system further includes a couple of first levers and a couple of second levers, and wherein the couple of first levers have first ends fixed to the third plate and second ends connected to third ends of the couple of second levers through a shaft bearing, the couple of second levers have the third ends and fourth ends fixed to the first plate, and the driving unit moves connecting portions of the first and second levers vertically.

2. The device according to claim 1, wherein the second, third and fourth plates between the first and fifth plates have substantially the same size, and wherein each of the first, second, third, fourth and fifth plates is connected to an adjacent plate by a hinge bracket.

3. The device according to claim 1, wherein the shaft is connected to the eccentric cam through a ball bearing.

4. The device according to claim 3, wherein a switch cam is installed onto the eccentric cam having first and second switch grooves, and first and second motor switches having switches corresponding to the first and second switch grooves are installed at both sides of the switch cam.

5. The device according to claim 4, wherein the eccentric cam rotates halfway.

6. The device according to claim 1, wherein the driving unit includes an angle bearing installed to a shaft, a couple of bearing stoppers disposed at both sides of the angle bearing and fixed to the joint plate, and a shaft fixing block supporting an end of the shaft, and wherein a spring is wound around the shaft between the angle bearing and the shaft fixing block.

7. The device according to claim 6, wherein the shaft bearing includes a first roller and a couple of second rollers at both sides of the first roller, and wherein the angle bearing has an inclined surface contacting the first roller, and the couple of bearing stoppers have curved surfaces facing the inclined surface and contacting the second rollers.

8. A method of driving a variable display device, which includes a display panel; a joint plate installed at a rear surface of the display panel; and a pair of driving systems installed at a rear surface of the joint plate and facing against each other, wherein each driving system includes a motor, an eccentric cam being eccentric with respect to a rotation axis of the motor, a shaft connected to the eccentric cam through a ball bearing, a couple of first levers having first ends fixed to a central area of the joint plate and second ends, a couple of second levers having third ends connected to the second ends through a shaft bearing and fourth ends fixed to an edge portion of the joint plate, an angle bearing installed to the shaft, a couple of bearing stoppers disposed at both sides of the angle bearing and fixed to the joint plate, and a shaft fixing block supporting an end of the shaft, and wherein a spring is wound around the shaft between the angle bearing and the shaft fixing block, the method comprising:

rotating the eccentric cam at each of both edge portions of the joint plate in less than a full revolution by driving the motor;

elastically compressing the spring by moving the shaft and the angle bearing toward a first direction by rotation of the eccentric cam;

pushing and raising the shaft bearing;

raising connecting portions of the first and second levers by the shaft bearing;

rotating first, second, third, fourth and fifth plates of the joint plate connected to the first and second levers such that the first, second, third, fourth and fifth plates are rotated toward an opposite direction to the rear surface of the joint plate with increasing rotational angles as approaching edge portions of the joint plate from a center of the joint plate;

driving the variable display device in a curved mode such that the display panel has a curved surface according to the joint plate;

expanding and restoring the spring by rotating the eccentric cam by the motor in less than a full revolution, thereby moving the shaft toward a second direction opposite to the first direction;

lowering the shaft bearing;

lowering the connecting portions of the first and second levers by the shaft bearing;

rotating the first, second, third, fourth and fifth plates of the joint plate connected to the first and second levers such that the first, second, third, fourth and fifth plates are disposed on a line; and driving the variable display device in a flat mode such that the display panel has a flat surface according to the joint plate.

9. The method according to claim 8, wherein pushing and raising the shaft bearing includes pushing and raising a first roller of the shaft bearing along an inclined surface of the angle bearing and pushing and raising second rollers of the shaft bearing along curved surfaces of the bearing stoppers, and wherein the first roller is disposed between the second rollers.

10. The method according to claim 8, wherein lowering the shaft bearing includes lowering a first roller of the shaft bearing along an inclined surface of the angle bearing and lowering second rollers of the shaft bearing along curved surfaces of the bearing stoppers, and wherein the first roller is disposed between the second rollers.

11. A variable display device, comprising:

a display panel;

a joint plate installed at a rear surface of the display panel and including a center plate between a plurality of plates each configured to be rotated by a hinge; and a pair of driving systems installed at a rear surface of the joint plate, facing against each other and rotating the plurality of plates with respect to a normal direction to the joint plate, each driving system including a motor unit on the center plate and a driving unit on an immediately adjacent plate, wherein the motor unit includes a motor, an eccentric cam being eccentric with respect to a rotation axis of the motor, and a shaft connected to the eccentric cam, and wherein the display panel is variably driven in a flat mode having a flat surface or a curved mode having a curved surface by the joint plate and the driving system, wherein each driving system further includes a couple of first levers and a couple of second levers, and wherein the couple of first levers have first ends fixed to the third plate and second ends connected to third ends of the couple of second levers through a shaft bearing, the couple of second levers have the third ends and fourth ends fixed to the first plate, and the driving unit moves connecting portions of the first and second levers vertically.

12. The device according to claim 11, wherein the joint plate includes first, second, third, fourth and fifth plates, with the third plate being the center plate, and the second, third and fourth plates between the first and fifth plates have substantially the same size, and wherein each of the first, second, third, fourth and fifth plates is connected to an adjacent plate by a hinge bracket.

13. The device according to claim 12, wherein the shaft is connected to the eccentric cam through a ball bearing.

14. The device according to claim 13, wherein a switch cam is installed onto the eccentric cam having first and second switch grooves, and first and second motor switches having switches corresponding to the first and second switch grooves are installed at both sides of the switch cam.

15. The device according to claim 14, wherein the eccentric cam rotates halfway.

16. The device according to claim 11, wherein the driving unit includes an angle bearing installed to a shaft, a couple of bearing stoppers disposed at both sides of the angle bearing and fixed to the joint plate, and a shaft fixing block supporting an end of the shaft, and wherein a spring is wound around the shaft between the angle bearing and the shaft fixing block.

17. The device according to claim 16, wherein the shaft bearing includes a first roller and a couple of second rollers at both sides of the first roller, and wherein the angle bearing has an inclined surface contacting the first roller, and the couple of bearing stoppers have curved surfaces facing the inclined surface and contacting the second rollers.

* * * * *